United States Patent

[19]

Kang

[11] Patent Number: 5,993,735

[45] Date of Patent: Nov. 30, 1999

[54] GOLD-BASED ALLOY FOR BONDING WIRE OF SEMICONDUCTOR DEVICE

[76] Inventor: Do-Won Kang, 145-8, Byongsan-ri, Kangsang-myon, Yangpyong-gun, Kyungki-do, Rep. of Korea

[21] Appl. No.: 09/087,367

[22] Filed: May 29, 1998

[51] Int. Cl.$^6$ .................................................. C22C 5/02
[52] U.S. Cl. .......................................... 420/508; 148/430
[58] Field of Search ........................... 148/430; 420/508, 420/511

[56] References Cited

U.S. PATENT DOCUMENTS 4,752,442   6/1988   Asada et al. ............................. 420/507

OTHER PUBLICATIONS

Abstract of JP–410294328A, Nov. 4, 1988.
Abstract of JP–40100441A, Jan. 9, 1989.
Abstract of JP–408199261A, Aug. 6, 1996.

*Primary Examiner*—John P Sheehan
*Attorney, Agent, or Firm*—Cooper & Dunham LLP

[57] ABSTRACT

The present invention relates to an alloy for bonding wire used to connect a semiconductor chip and a lead frame and, more particularly, to a gold-based alloy for bonding wire of a semiconductor device which is excellent in the strengths at room temperature and under hot conditions after bonding, capable of controlling the ball size to be smaller in bonding, and preventive of a short between wires, the gold-based alloy for bonding wire of a semiconductor device being characterized by containing 0.5 to 5.0 wt. % of Pd, 5 to 50 wt.PPM of Ba, each 1 to 10 wt.PPM of at least one selected from the group consisting of Be and Ca, and Au for the rest, thereby having excellent strengths at room temperature and under hot conditions after bonding, controlling the size of a ball smaller, and preventing a short between wires.

1 Claim, No Drawings

GOLD-BASED ALLOY FOR BONDING WIRE OF SEMICONDUCTOR DEVICE

BACKGROUND OF THE INVENTION

1. Field of the Invention

The present invention relates to an alloy for bonding wire used to connect a semiconductor chip and a lead frame and, more particularly, to a gold-based alloy for bonding wire of a semiconductor device which is excellent in the strengths at room temperature and under hot conditions after bonding, capable of controlling the ball size to be smaller in bonding, and preventive of a short between wires.

2. Discussion of Related Art

The material generally used for the bonding wire of a semiconductor device is made of an alloy prepared by adding elements (hereinafter, referred to as "dopant") of several PPM or several scores of PPM to the at least 99.999% highly purified gold, and its mechanical properties depend upon the type and amount of the dopant to be added.

To select a wire appropriate to the characteristic of package is of great importance since there are so many kinds of semiconductor packages and each type of wire has its bonding methods.

As the semiconductor chips have been highly miniaturized and the semiconductor mounting techniques with high density have been rapidly developed in recent years, the number of terminals to be connected with bonding wire becomes increased, and accordingly, the gap between the pads gets much smaller in addition to the miniaturization of bonding pad itself. There is thus an increasing demand for bonding wire satisfying the above requirements.

The following characteristics are required in accordance with the trend of semiconductor package as described above.

First, the bonded wire is required to be high in the strengths at room temperature and under hot conditions with the gap between bonded wires getting smaller, so as not to be bent or get curved.

Second, it is needed to control the ball size smaller in bonding, bring the bond strength excellent after bonding, with reduction in the gap between the pad to be bonded. Moreover, the increased bonding length and decreased bonding gap demand us to minimize the sweeping of epoxy-mold wire for the prevention of a short between the wires.

SUMMARY OF THE INVENTION

Accordingly, the present invention is directed to a gold-based alloy for bonding wire of a semiconductor device that substantially obviates one or more of the problems due to limitations and disadvantages of the related art.

An object of the present invention is to provide a gold-based alloy for bonding wire of a semiconductor element having the characteristics required according to the inclination of semiconductor package, the gold-based alloy having the excellent strengths at room temperature and under hot conditions after bonding, capable of controlling the ball size reduced in bonding, and preventive of a short between the wires.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof.

To achieve these and other advantages and in accordance with the purpose of the present invention, as embodied and broadly described, a gold-based alloy for bonding wire of a semiconductor device is characterized by containing 0.5 to 5.0 wt. % of Pd, 5 to 50 wt.PPM of Ba, each 1 to 10 wt.PPM of at least one selected from the group consisting of Be and Ca, and Au for the rest, thereby having excellent strengths at room temperature and under hot conditions after bonding, controlling the size of a ball smaller, and preventing a short between wires.

It is to be understood that both the foregoing general description and the following detailed description are exemplary and explanatory and are intended to provide further explanation of the invention as claimed.

DETAILED DESCRIPTION OF PREFERRED EMBODIMENT

Reference will now be made in detail to the preferred embodiments of the present invention.

A gold-based alloy for bonding wire of a semiconductor device according to the present invention is to enhance the various characteristics required for the bonding wire made of an alloy prepared by adding 0.5 to 5.0 wt. % of Pd, 5 to 50 wt.PPM of Ba, and each 1 to 10 wt.PPM of at least one selected from the group consisting of Be and Ca, to at least 99.999% gold highly purified by two steps, i.e., electrochemical purification and local melting purification.

Hereinafter, there will be described the functions of each components constituting the gold-based alloy for bonding wire of a semiconductor device according to the present invention and the reason for limiting the values.

An addition of Pd which forms a homogeneous solid solution with gold (Au) causes the tensile strength at room temperature as well as hot strength to be increased and makes it possible to prevent the wire from being bent or curved after bonding. It also suppresses the growth of grains in the neck of the ball which is the most subjected to heat in forming the ball, thereby preventing the loop from becoming higher in bonding and enhancing the strength of the neck under hot conditions. This does not appear with the amount of Pd less than 0.5 wt. %, while an addition of Pd in the amount of greater than 5 wt. % makes the wire too brittle to be bonded with the pad in bonding. The amount of Pd to be added is thus limited in the range of 0.5 to 5 wt. %.

Ba increases the tensile strength under hot conditions and inhibits the growth of grains in the heat treatment to bring about the formation of a structure entirely having fine crystalline particles, so that it is possible to reduce the sagging of the wire after formation of the loop and prevent the sweeping wire from being short in epoxy-molding. Furthermore, an addition of Ba causes the internal stress to be increased in processing the material, much of the stress being left in the material when heating the material in order to form a ball in wire bonding, thereby reducing the size of the ball. This characteristic is very excellent compared to that of a conventional Au—Pd alloy wire (Japanese Patent Publication So. 62-23455). The amount of Ba being less than 5 wt.PPM has an insignificant effect and an addition of Ba greater than 50 wt.PPM is too effective so that the loop is not made uniform in bonding.

Be increases the tensile strength at room temperature and make the crystalline particles fine in formation of ball, thereby preventing the wire from being curved after formation of the loop. This is not affected with the amount of Be less than 1 wt.PPM, while greater than 10 wt.PPM of Be may cause a brittle failure in the neck of the ball after wire bonding due to over-doping of Be. The amount of Be to be added is thus limited in the range of 1 to 10 wt.PPM.

Ca increases the thermal resistance of the material to enhance the tensile strength under hot conditions and suppresses the growth of grains in the neck of ball, making it possible to prevent the loop from being higher. It also enhances the toughness so as to reduce the failure in the neck of ball after ball bonding and especially to prevent the neck from being broken even when the wire is processed thin. Moreover, even the wire bent has a large elastic range enough to be restored to the original loop form. These are not affected with the amount of Ca less than 1 wt.PPM, while greater than 10 wt.PPM of Ca incorporating into the crystalline particles raises the processing hardness of wire to cause the fraction in the chip in bonding. Therefore, the amount of Ca to be added is limited in the range of 1 to 10 wt.PPM.

Hereinafter, the present invention will be described in further detail with reference to the preferred embodiments.

EMBODIMENTS

To prepare a 33 μm in diameter wire, the respective alloy elements and additives as listed in Table 1 are first added to the at least 99.999% highly purified gold. The mixture is then completely melt and subjected to circular forging and solid drawing into a wire of 33 μm in diameter. The wire is subjected to the heat treatment in order to obtain appropriate mechanical characteristics, and its strengths at room temperature and under hot conditions are determined by the measurements of mechanical properties of the material such as breaking load and elongation percentage. Table 2 shows the ball size in bonding, the bond strength after bonding, and the wire sweeping.

The samples according to embodiments 1 to 15 are wires made of a gold-based alloy for bonding wire of a semiconductor device having the compositions as limited within the range of the present invention, those according to conventional examples 1 and 2 being wires consisting of a conventional alloy which contains neither Pd nor Ba, that according to comparative example 1 being a wire made of the gold-based alloy that contains Pd without Ba.

Tables 1 and 2 show that the preferred embodiments 1 to 15 according to the present invention have the strengths at room temperature and under hot conditions considerably higher than those of the conventional examples or the comparative example, and that the wire sweeping rate becomes lowered with the reduction in the diameter of ball.

TABLE 1

| SAMPLE | DIV. COMPOSITION (wt. %) | | | | |
|---|---|---|---|---|---|
| | Au (99.999%) | Pd | Ba | Be | Ca |
| EMBODIMENT 1 | RESIDUAL | 5.0 | 0.0005 | 0.00001 | — |
| EMBODIMENT 2 | " | 3.0 | 0.003 | 0.0005 | — |

TABLE 1-continued

| SAMPLE | DIV. COMPOSITION (wt. %) | | | | |
|---|---|---|---|---|---|
| | Au (99.999%) | Pd | Ba | Be | Ca |
| EMBODIMENT 3 | " | 1.5 | 0.001 | 0.0007 | — |
| EMBODIMENT 4 | " | 1.0 | 0.005 | 0.0005 | — |
| EMBODIMENT 5 | " | 0.5 | 0.002 | 0.001 | — |
| EMBODIMENT 6 | " | 5.0 | 0.0005 | — | 0.00001 |
| EMBODIMENT 7 | " | 3.0 | 0.003 | — | 0.0005 |
| EMBODIMENT 8 | " | 1.5 | 0.001 | — | 0.0007 |
| EMBODIMENT 9 | " | 1.0 | 0.005 | — | 0.0005 |
| EMBODIMENT 10 | " | 0.5 | 0.002 | — | 0.001 |
| EMBODIMENT 11 | " | 5.0 | 0.0005 | 0.00001 | 0.00001 |
| EMBODIMENT 12 | " | 3.0 | 0.003 | 0.0005 | 0.0005 |
| EMBODIMENT 13 | " | 1.5 | 0.001 | 0.0007 | 0.0007 |
| EMBODIMENT 14 | " | 1.0 | 0.005 | 0.0005 | 0.0005 |
| EMBODIMENT 15 | " | 0.5 | 0.002 | 0.001 | 0.001 |
| CONVENTIONAL EXAMPLE 1 | " | — | — | 0.0007 | — |
| CONVENTIONAL EXAMPLE 2 | " | — | — | 0.0007 | 0.0005 |
| COMPARATIVE EXAMPLE 1 | " | 1.03 | — | — | 0.0014 |

TABLE 2

| SAMPLE | DIV. | | | | | | |
|---|---|---|---|---|---|---|---|
| | (1) | | (2) | | RESULTS | | |
| | A | B | C | D | E | F | G |
| EMBODIMENT 1 | 24.1 | 7.5 | 20.0 | 3.8 | 57.8 | 56.6 | 3.5 |
| EMBODIMENT 2 | 24.0 | 7.5 | 20.1 | 4.2 | 52.6 | 58.2 | 2.5 |
| EMBODIMENT 3 | 23.6 | 7.6 | 19.7 | 4.1 | 54.1 | 60.5 | 2.7 |
| EMBODIMENT 4 | 23.1 | 7.7 | 19.6 | 4.2 | 46.4 | 58.1 | 2.0 |
| EMBODIMENT 5 | 23.4 | 7.7 | 19.5 | 4.2 | 49.9 | 56.9 | 2.3 |
| EMBODIMENT 6 | 23.8 | 7.5 | 20.9 | 4.4 | 56.9 | 58.7 | 3.6 |
| EMBODIMENT 7 | 23.1 | 7.5 | 20.4 | 4.1 | 50.5 | 60.6 | 2.5 |
| EMBODIMENT 8 | 22.9 | 7.6 | 20.3 | 4.1 | 53.1 | 61.1 | 2.6 |
| EMBODIMENT 9 | 22.7 | 7.5 | 20.1 | 3.8 | 45.2 | 59.3 | 2.1 |
| EMBODIMENT 10 | 22.7 | 7.6 | 20.2 | 4.0 | 47.6 | 56.6 | 2.4 |
| EMBODIMENT 11 | 24.2 | 7.5 | 20.8 | 4.0 | 55.3 | 57.5 | 3.5 |
| EMBODIMENT 12 | 24.2 | 7.6 | 20.5 | 4.2 | 50.1 | 59.4 | 2.5 |
| EMBODIMENT 13 | 23.9 | 7.5 | 20.1 | 4.2 | 52.9 | 60.1 | 2.7 |
| EMBODIMENT 14 | 23.8 | 7.6 | 19.8 | 4.1 | 45.0 | 59.2 | 2.2 |
| EMBODIMENT 15 | 23.6 | 7.6 | 19.6 | 4.1 | 46.9 | 56.3 | 2.4 |
| CONVENTIONAL EXAMPLE 1 | 16.5 | 7.5 | 8.9 | 1.3 | 68.6 | 54.5 | 4.3 |
| CONVENTIONAL EXAMPLE 2 | 17.5 | 7.5 | 13.3 | 2.7 | 59.5 | 55.8 | 3.6 |
| COMPARATIVE EXAMPLE 1 | 22.4 | 4.1 | 18.2 | 2.3 | 58.2 | 50.1 | 3.7 |

**(1) STRENGTH AT ROOM TEMPERATURE
(2) STRENGTH UNDER HOT CONDITIONS

A: BREAKING LOAD (Gr)

B: ELONGATION PERCENTAGE (%)

C: BREAKING LOAD (Gr)

D: ELONGATION PERCENTAGE (%)

E: BALL DIAMETER (μm)

F: BOND STRENGTH (Gr)

G: WIRE SWEEPING (%)

Accordingly, the wire prepared from the gold-based alloy for bonding wire of a semiconductor device of the present invention has excellent strengths at room temperature and under hot conditions after bonding, is capable of controlling the ball size to be smaller, and prevents the short between wires.

It will be apparent to those skilled in the art that various modifications and variations can be made in the gold-based alloy for bonding wire of a semiconductor device according to the present invention without departing from the spirit or scope of the invention. Thus, it is intended that the present invention cover the modifications and variations of this invention provided they come within the scope of the appended claims and their equivalents.

What is claimed is:

1. A gold-based alloy for use in a bonding wire of a semiconductor device, the alloy comprising:

0.5 to 5.0 wt. % of Pd, 0.0005 to 0.005 wt. % of Ba, at least one selected from the group consisting of 0.0001 to 0.001 wt. % of Be and 0.0001 to 0.001 wt. % of Ca, and the balance Au.

* * * * *